(12) United States Patent
Van Den Enden et al.

(10) Patent No.: US 6,411,225 B1
(45) Date of Patent: Jun. 25, 2002

(54) SAMPLE RATE CONVERTER

(75) Inventors: Adrianus Wilhelmus Maria Van Den Enden, Eindhoven (NL); Rutgerus Elisabertus Eduardus Franciscus Suermondt, Tau (NO); Marc Victor Arends, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/552,649

(22) Filed: Apr. 19, 2000

(30) Foreign Application Priority Data

Apr. 22, 1999 (EP) .............................. 99201234

(51) Int. Cl.⁷ ............................................... H03M 7/00
(52) U.S. Cl. ........................................................ 341/61
(58) Field of Search ............................................ 341/61

(56) References Cited

U.S. PATENT DOCUMENTS

| | | | |
|---|---|---|---|
| 4,748,578 A | 5/1988 | Lagadec et al. | ............ 364/724 |
| 5,274,372 A | 12/1993 | Luthra et al. | .................. 341/61 |
| 5,349,548 A | 9/1994 | Nillesen | ................ 364/724.01 |
| 5,497,152 A * | 3/1996 | Wilson et al. | ................. 341/61 |
| 5,559,513 A | 9/1996 | Rothermel et al. | ............ 341/61 |
| 5,625,581 A | 4/1997 | Nillesen | ................ 364/724.01 |
| 5,907,295 A * | 5/1999 | Lin | .............................. 341/61 |
| 5,982,305 A * | 11/1999 | Taylor | .......................... 341/61 |
| 6,134,268 A * | 10/2000 | McCoy | ......................... 341/61 |

* cited by examiner

*Primary Examiner*—Trong Phan
(74) *Attorney, Agent, or Firm*—Daniel J. Piotrowski

(57) ABSTRACT

Sample rate converters are known, and are used to convert a signal with a first sample rate (sampling frequency) into a signal with a second sample rate (sampling frequency). To obtain a flexible sample rate converter with sampling frequencies that are not known beforehand, until now only sample rate converters with very high intermediate sampling frequencies are known. The invention provides a flexible sample rate converter, which is able to handle unknown input and output sampling frequencies. This is achieved by using polyphase decomposition filter means in combination with interpolation means.

7 Claims, 2 Drawing Sheets

SAMPLE RATE CONVERTER

FIELD OF THE INVENTION

The invention relates to a sample rate converter.

BACKGROUND OF THE INVENTION

Sample rate converters are known in the art and are used to convert a digital signal with a first (input) sample rate (sampling frequency) into a digital signal with a second (output) sample rate (sampling frequency). The sample rate can be increased (up-converter) or decreased (down converter).

Such sample rate converters are required when processing signals of a system using a first sampling rate in a system, which uses a second sampling rate. For example compact disc uses 44.1 kHz, digital audiotape uses 48 kHz and satellite broadcasting uses 32 kHz.

If the ratio between the original frequency and the target frequency is not a whole number, known sample rate converters need a very high intermediate conversion frequency. Further a multiplicity of circuits and filters use multiple stages and the number of sets of coefficients that are necessary grows in proportion to the intermediate frequency. Further more these methods do not allow different target frequencies to be selected using a single circuit.

In U.S. Pat. No. 5,349,548 and U.S. Pat. No. 5,625,581 non-integral delay circuits are described that can be used in such a sample rate converter. From U.S. Pat. No. 4,748,578 a sample rate converter is known which has a selectable output frequency, but with a high intermediate frequency.

From U.S. Pat. No. 5,559,513 a sample rate converter is known that tries to solve the complexity of known sample rate converters by using first an up-conversion with a factor N (the required resolution of the output signal) creating an intermediate signal, followed by a linear interpolation between two adjacent samples of the intermediate signal based on the ratio between the input and the output sample rate.

A disadvantage of this known sample rate converter is that the linear interpolator that is used herein has to calculate all samples at the high sample rate. Further a moving time averager is used to supply a sum signal to the linear interpolator.

OBJECT AND SUMMARY OF THE INVENTION

An object of the invention is to overcome the disadvantages of the prior art and further to obtain a sample rate converter which both can be used as up-converter and as down-converter using the same circuit.

To this end a first aspect of the invention provides a sample rate converter as defined in claim 1.

The sample rate converter of the present invention has as advantages that it is only necessary to calculate the samples that are necessary instead of calculating all the samples as the prior art sample rate converters do. Further a moving time averager is not necessary.

This is achieved by realizing that by using the combination of polyphase decomposition filter means and interpolation means a very efficient flexible sample rate converter can be obtained.

A considerable smaller number of calculations per second are needed and a considerable smaller number of coefficients have to be calculated and stored.

Further the sample rate converter is able to handle arbitrary input and output sampling frequencies.

The only thing that has to be known beforehand is the required suppression of the so-called mirror spectra and the necessary relative bandwidth. On the basis of this information the filter-coefficients are chosen and these coefficients can be used for both the up-sampler as the down-sampler.

An embodiment of a sample rate converter according to the invention comprises the features of claim 2.

By adding an auxiliary up-converter in front of the series-arrangement, the operation of the flexible sample rate converter is further improved. By using the auxiliary up-converter the up-conversion can be splitted in more stages, which improves the performance.

An embodiment of a sample rate converter according to the invention comprises the features of claim 3.

An embodiment of a sample rate converter according to the invention comprises the features of claim 4.

By using the measures of the invention it is possible to use the flexible sample rate converter for both up- as for down-conversion.

Further the filters are beforehand determined on the basis of the required image suppression (mirror spectra) and necessary relative bandwidth.

Further embodiments are described in the other dependent claims.

BRIEF DESCRIPTION OF THE DRAWING

The invention and additional features, which may optimally be used to implement the invention to advantage, will be apparent from and elucidated with reference to the examples described below hereinafter and shown in the figures. Herein shows.

DETAILED DESCRIPTION OF THE PRIMARY EMBODIMENT

Figure 1:
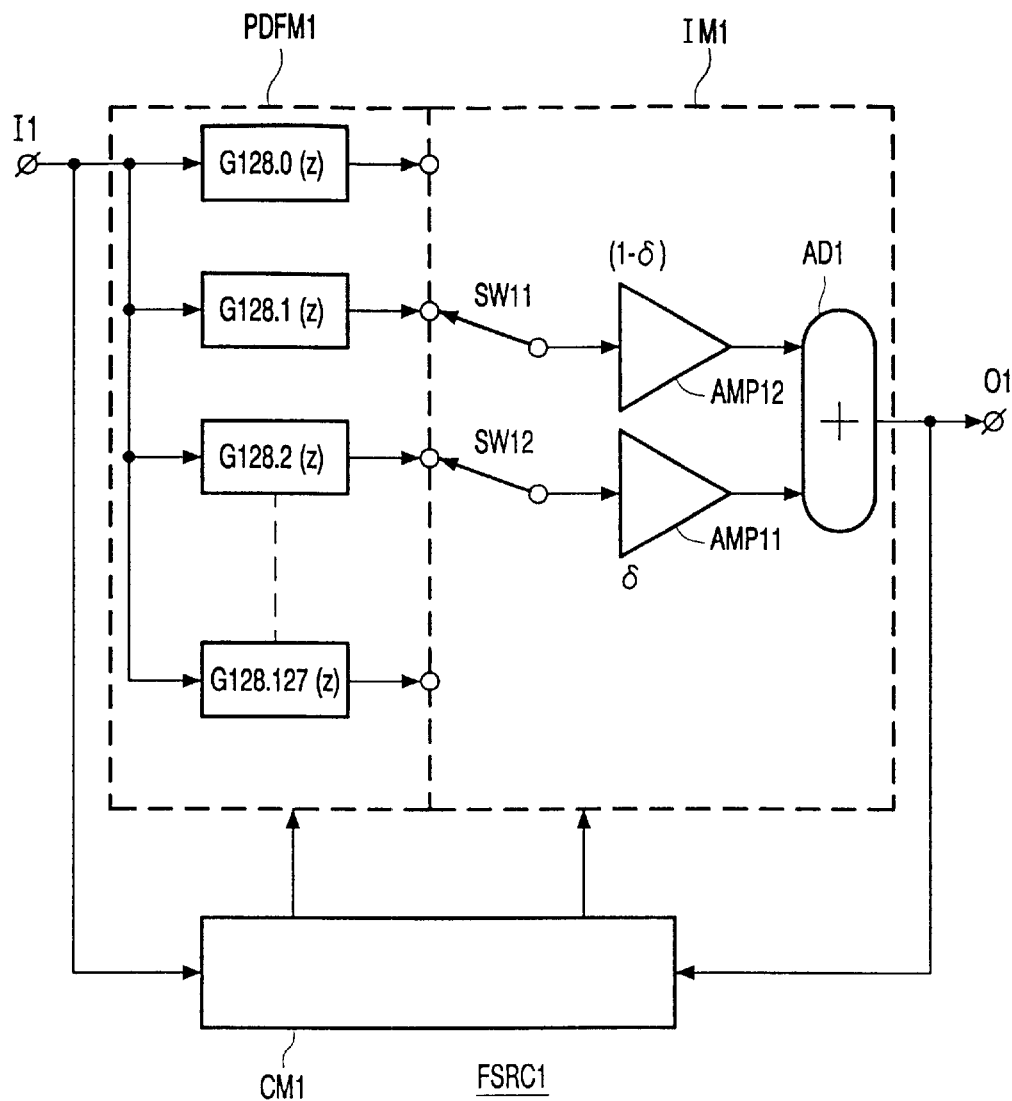
FIG. 1 a block schematic example of a sample rate converter as an up-converter.

FIG. 1 shows a first example of a flexible sample rate converter FSRC1 embodied as an up-converter according to the invention having an input I1 and an output O1. This flexible sample rate converter comprises a series-arrangement of polyphase decomposition filter means PDFM1 and interpolation means IM1.

Further the flexible sample rate converter comprises control means CM1 that control the operation of the polyphase decomposition filter means PDFM1 and the interpolation means IM1.

In this context flexible means that the actual ratio between the input and output sampling frequencies does not have to be known in advance. Instead, the required amount of suppression of the images created in the conversion process has to be known. These images may lead to unwanted aliasing. This information and the relative bandwidth are needed to design the interpolating filters.

The polyphase decomposition filter means PDFM1 comprises in this example 128 polyphase branches ($G128,0$ $(z)$–$G128,127$ $(z)$). In this example the outputs of the polyphase branches are coupled to switches SW11 and SW12 of the interpolation means IM1. The interpolation means further comprises a first and a second amplifier AMP11 and AMP12, whereby the amplifier AMP11 amplifies the received signal with a factor δ and whereby the amplifier AMP12 amplifies the received signal with a factor (1-δ).

The outputs of the amplifiers are coupled to an adder AD1 that supplies the summed signal to the output O1 of the flexible sample rate converter FSRC1.

The control means CM1 determines the value of δ. Further the control means determines which pair of samples has to be calculated, in case of linear interpolation.

Figure 2:
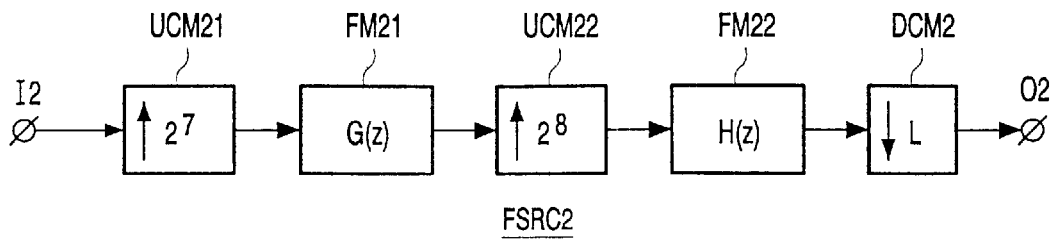
FIG. 2 a functional example of a flexible sample rate converter as an up-converter, FIG. 3 a blocks schematic example of a sample rate converter as a down-converter, and FIG. 4 a functional example of a flexible sample rate converter as a down-converter.

FIG. 2 shows a functional example of a flexible sample rate converter FSRC2 as an up-converter. The flexible sample rate converter comprises in this example a series-arrangement of first up-conversion means UCM21, first filter means FM21, second up-conversion means UCM22, second filter means FM22 and down conversion means DCM2. By splitting the up-conversion in two stages with filter means in between the efficiency of the sample rate converter is improved. The transition band of the first filter means can be chosen very narrow and the transition band of the second filter means can be chosen very broad.

Figure 3:
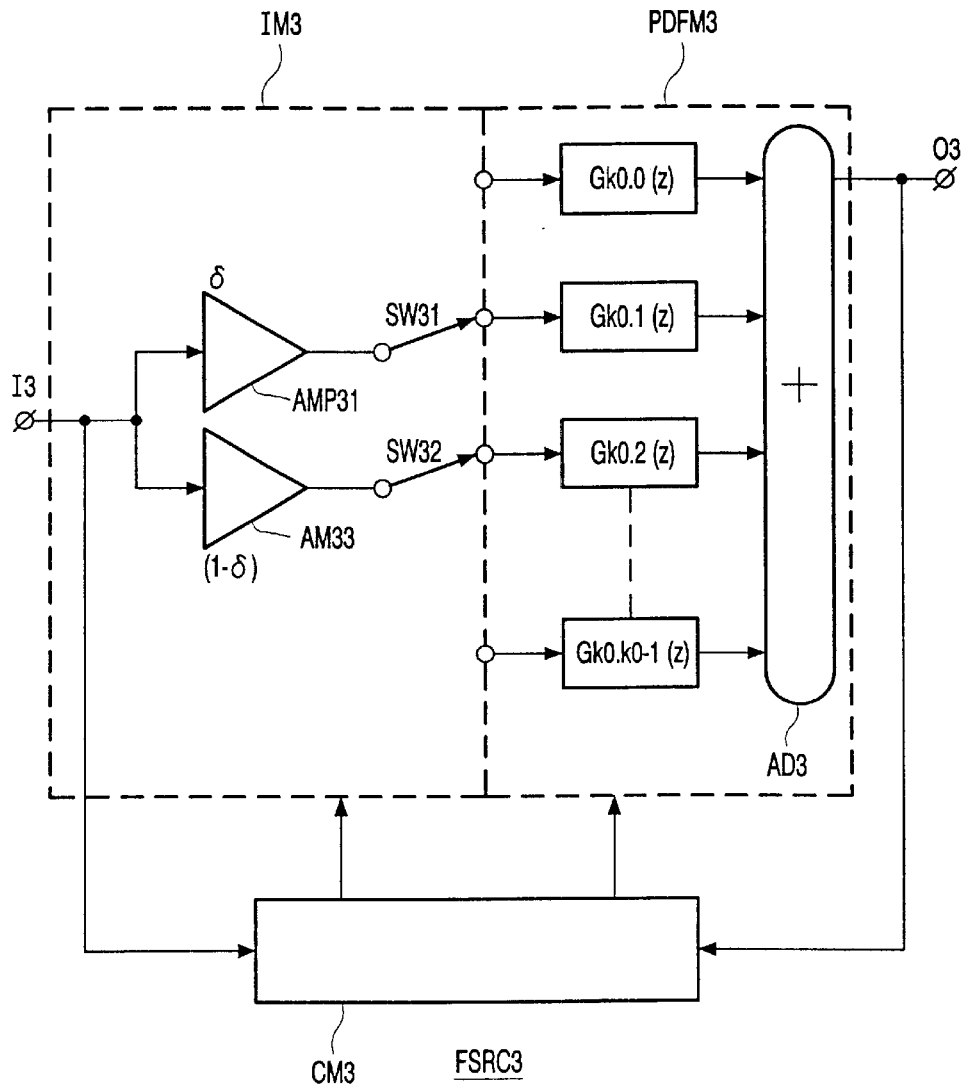

FIG. 3 shows a practical example of a flexible sample rate converter as a down-converter FSRC3 having an input 13 and an output O3. This flexible sample rate converter comprises a series-arrangement of interpolation means IM3 and polyphase decomposition filter means PDFM3 having Ko branches (Gko,0 (z)–Gko,Ko-1 (z)). Further the flexible sample rate converter comprises control means CM3 for controlling the operation of the interpolation means and the polyphase decomposition filter means.

The flexible sample rate converter according to this example (as down-converter) is the transposed version of the flexible sample rate converter (as up-converter, see FIG. 1), in this way it is possible to use the same flexible sample rate converter for both up- and down-conversion by interchanging the input 13 and the output O3. The man skilled in the art is well aware of the changes to be performed to obtain the transposed circuit.

Figure 4:
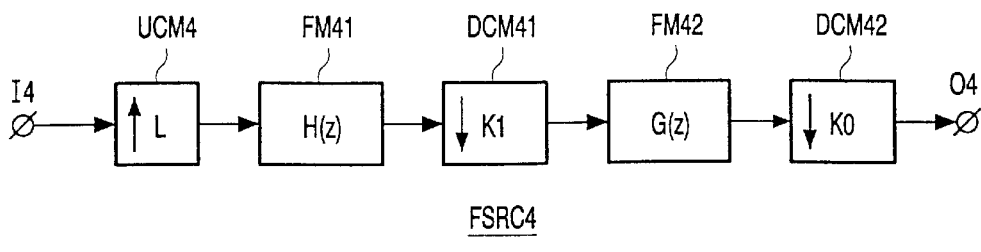

FIG. 4 shows a functional example of a flexible sample rate converter as a down-converter FSRC4, whereby between an input 14 and an output O4 a series-arrangement of up-converting means UCM4, first filter means FM41, first down-conversion means DCM41, second filter means FM42 and second down-conversion means DCM42 is placed. The factors can be chosen as required, whereby Ko and Kl are fixed integers and L<=Ko*Kl. The first filter means FM41 can be implemented as a linear interpolator.

The invention has been described on the basis of some examples. The man skilled in the art will be well aware of a lot of variations falling within the scope of the invention.

Instead of the described linear interpolation it is also possible to use a higher order interpolation in case this is required. For example to obtain a more precise estimation of the sample to be interpolated.

Further one or more up-conversion stages can be added, for example to lower the up-conversion factor of the other stages.

What is claimed is:

1. Flexible sample rate converter comprising a series-arrangement of polyphase decomposition filter means and interpolator means, whereby one side of the series-arrangement is coupled to an input of the flexible sample rate converter for receiving an input signal with a first sampling frequency and the other side of the series-arrangement is coupled to an output for supplying an output signal with a second sampling frequency, and the flexible sample rate converter comprises a single control means for controlling the polyphase decomposition filter means and the interpolation means.

2. Flexible sample rate converter as claimed in claim 1, characterized in that the flexible sample rate converter comprises an auxiliary up-converter with an up-conversion of at least two, whereby in operation the sampling frequency or frequencies used in the flexible sample rate converter are lower than or equal to the highest frequency of the input and output sampling frequencies multiplied with the auxiliary up-conversion factor.

3. Flexible sample rate converter as claimed in claim 1, characterized in that the flexible sample rate converter is an up-converter whereby the input is coupled to the polyphase decomposition filter means and the output is coupled to the interpolation means.

4. Flexible sample rate converter as claimed in claim 1, characterized in that the flexible sample rate converter is a down converter whereby the input is coupled to the interpolation means and the output is coupled to the polyphase decomposition filter means.

5. Flexible sample rate converter as claimed in claim 1, characterized in that the interpolation means are linear interpolation means.

6. Flexible sample rate converter as claimed in claim 1, characterized in that the interpolation means is higher order interpolation means.

7. Flexible sample rate converter as claimed in claim 1, characterized in that the polyphase decomposition filter means comprise 128 polyphase branches whereby only those samples that have to be interpolated are determined under control of the control means.

* * * * *